United States Patent
Kamon

[11] Patent Number: 5,300,972
[45] Date of Patent: Apr. 5, 1994

[54] PROJECTION EXPOSURE APPARATUS

[75] Inventor: Kazuya Kamon, Itami, Japan

[73] Assignee: Mitsubishi Denki Kabushiki Kaisha, Tokyo, Japan

[21] Appl. No.: 14,145

[22] Filed: Feb. 5, 1993

[30] Foreign Application Priority Data

Feb. 10, 1992 [JP] Japan ................. 4-023744

[51] Int. Cl.⁵ ............. G03B 27/72; G03B 27/42
[52] U.S. Cl. .............................. 355/71; 355/53
[58] Field of Search ............ 355/53, 67, 71; 356/338, 400, 401, 375, 237; 250/225

[56] References Cited

U.S. PATENT DOCUMENTS

| | | | |
|---|---|---|---|
| 4,740,079 | 4/1988 | Koizumi et al. | 356/237 |
| 4,864,123 | 9/1989 | Mizutani et al. | 250/225 |
| 4,922,308 | 5/1990 | Noguchi et al. | 356/237 |
| 4,938,598 | 7/1990 | Akiyama et al. | 356/375 |
| 4,952,815 | 8/1990 | Nishi | 250/548 |
| 5,004,348 | 4/1991 | Magome | 356/401 |
| 5,046,847 | 9/1991 | Nakata et al. | 356/338 |
| 5,048,967 | 9/1991 | Suzuki et al. | 356/401 |
| 5,070,250 | 12/1991 | Komatsu et al. | 250/548 |
| 5,133,603 | 7/1992 | Suzuki et al. | 356/400 |
| 5,171,999 | 12/1992 | Komatsu et al. | 250/548 |

Primary Examiner—Richard A. Wintercorn
Attorney, Agent, or Firm—Leydig, Voit & Mayer

[57] ABSTRACT

A projection exposure apparatus includes a light source, a condenser lens for condensing illumination light emanating from the light source onto a mask including a circuit pattern, a projection lens for condensing the illumination light that has passed through the mask onto a surface of a wafer, and a polarizer for converting the illumination light into linearly polarized light so that an inclined surface on the surface of the wafer is illuminated only with p-polarized light. It may also be arranged such that a single polarizer is not fixed in the optical path of the illumination light and a polarizer suited to an exposure process is selected from a plurality of polarizers and used. In that case, a device selectively positions one of a plurality of polarizers in the optical path of the illumination light so that an inclined surface on the surface of the wafer is illuminated only with p-polarized light.

8 Claims, 9 Drawing Sheets

PROJECTION EXPOSURE APPARATUS

BACKGROUND OF THE INVENTION

1. Field of the Invention

The present invention relates to a projection exposure apparatus for forming fine patterns required for manufacture of LSIs.

2. Description of the Related Art

Figure 9:
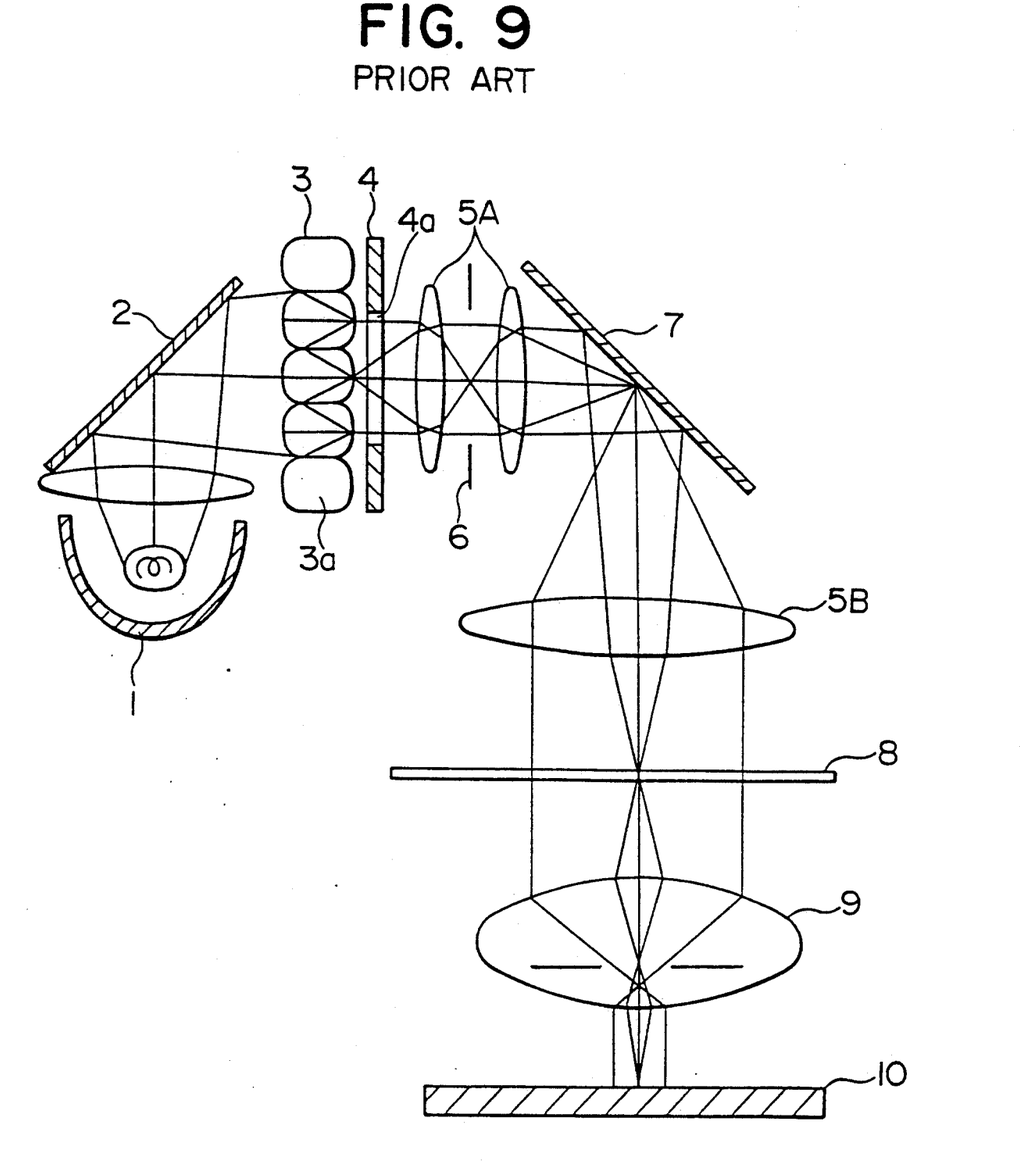
FIG. 9 shows an optical system of a conventional projection exposure apparatus.

FIG. 9 shows an optical system of a conventional projection exposure apparatus. The optical system includes a lamp house 1, a mirror 2, a fly's eye lens 3 disposed in front of the lamp house 1 with the mirror 2 between the lamp house 1 and the fly's eye lens 3 an aperture member 4 located in front of the fly's eye lens 3, a relay lens 5A, a stop 6, a mirror 7, a condenser lens 5B, a photo mask 8 on which a circuit pattern is formed, a projection lens 9, and a wafer 10 located in front of the mask 8 with the projection lens 9 between the mask 8 and the wafer 10.

Light rays emanating from the lamp house 1 reach the fly's eye lens 3 through the mirror 2, and are split into regions by the individual lenses 3a of the fly's eye lens 3. The rays which have passed through the individual lenses 3a pass through an aperture portion 4a of the aperture member 4, the relay lens 5A, the stop 6, the mirror 7 and the condenser lens 5B, and illuminate the entire surface of the exposure area of the mask 8. Therefore, on the surface of the mask 8, the rays from the individual lenses 3a of the fly's eye lens 3 are laid on top of one another, and the mask 8 is thus uniformly illuminated. The light rays which have passed through the mask 8 in the manner described above pass through the projection lens 9 and then reach the wafer 10. A resist film on the surface of the wafer 10 is exposed to this illumination light, whereby transfer of the circuit pattern is achieved.

Figure 10:
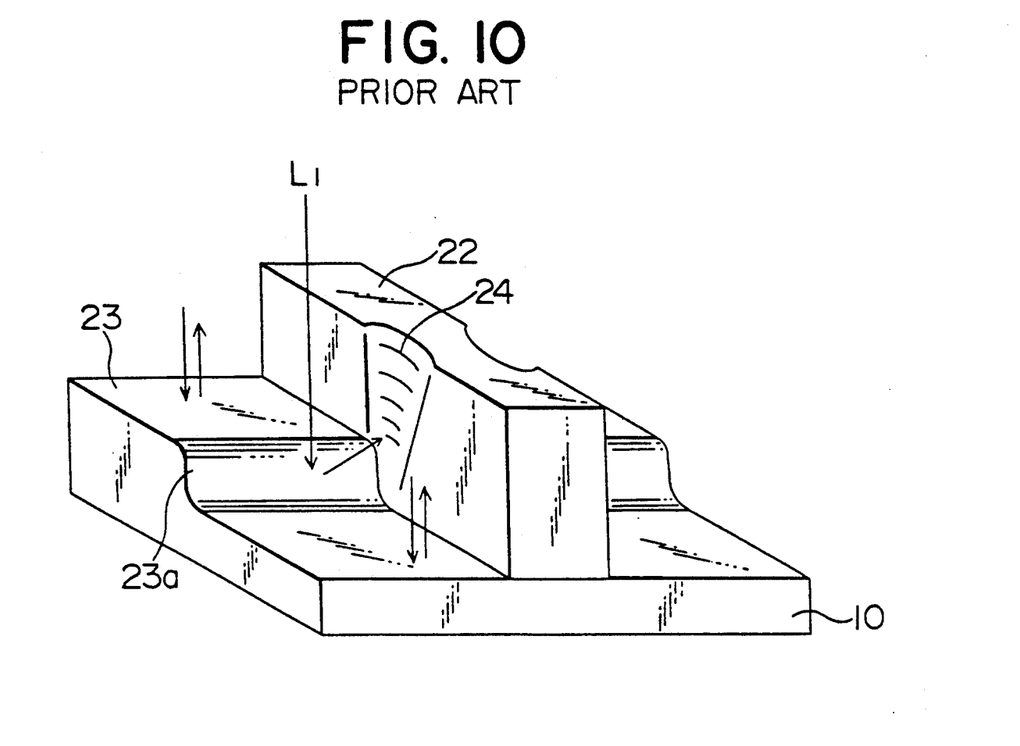
FIG. 10 is a perspective view showing the surface of a wafer exposed by the apparatus of FIG. 9.
Figure 11:
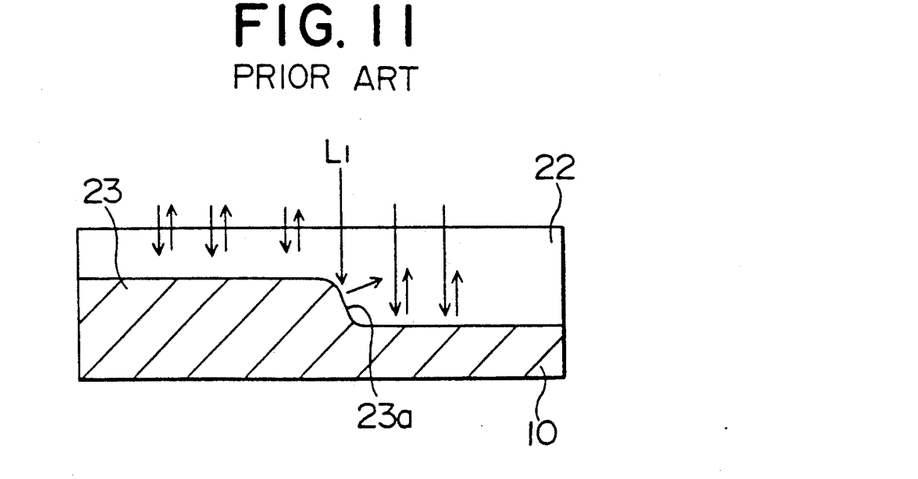
FIG. 11 is a cross-sectional view showing the surface of the wafer exposed by the apparatus of FIG. 9.

As a result, a resist pattern 22 such as that shown in FIGS. 10 and 11 is formed on the surface of the wafer 10. At that time, various types of shoulders 23 are present on the surface of the wafer 10 as a consequence of circuit formation. Therefore, light L1 which illuminates the vicinity of an edge of the shoulder 23 is reflected in a oblique direction by an inclined surface 23a part of this edge, causing halation. Consequently, the portion of the resist located near the edge is excessively exposed to the light, whereby a concavity 24 is formed in the resist pattern 22. Thus, in a conventional exposure apparatus, the resist dimension accuracy deteriorates due to halation.

SUMMARY OF THE INVENTION

Accordingly, an object of the present invention is to provide a projection exposure apparatus preventing deterioration in resist dimension accuracy due to halation.

In order to achieve the above object, according to one aspect of the present invention, there is provided a projection exposure apparatus which comprises a light source, a condenser lens for condensing an illumination light emanating from the light source onto a mask on which a circuit pattern has been formed, a projection lens for condensing the illumination light which has passed through the mask on a surface of a wafer, and a polarizer for converting the illumination light into a linearly polarized light so that an inclined surface on the surface of the wafer due to a shoulder can be illuminated with a p-polarized light alone.

According to another aspect of the present invention, there is provided a projection exposure apparatus which comprises a light source, a condenser lens for condensing an illumination light emanating from the light source onto a mask on which a circuit pattern has been formed, a projection lens for condensing the illumination light which has passed through the mask to a surface of a wafer, a plurality of polarizers for converting the illumination light into linearly polarized light having different planes of polarization and a device for selectively positioning one of the plurality of polarizers optical path of the illumination light so that an inclined surface on the surface of the wafer due to a shoulder can be illuminated with p-polarized light alone.

DESCRIPTION OF THE PREFERRED EMBODIMENTS

Embodiments of the present invention will be described below with reference to the accompanying drawings.

A first embodiment of the present invention will now be described with reference to FIGS. 1 through 4.

Figure 1:
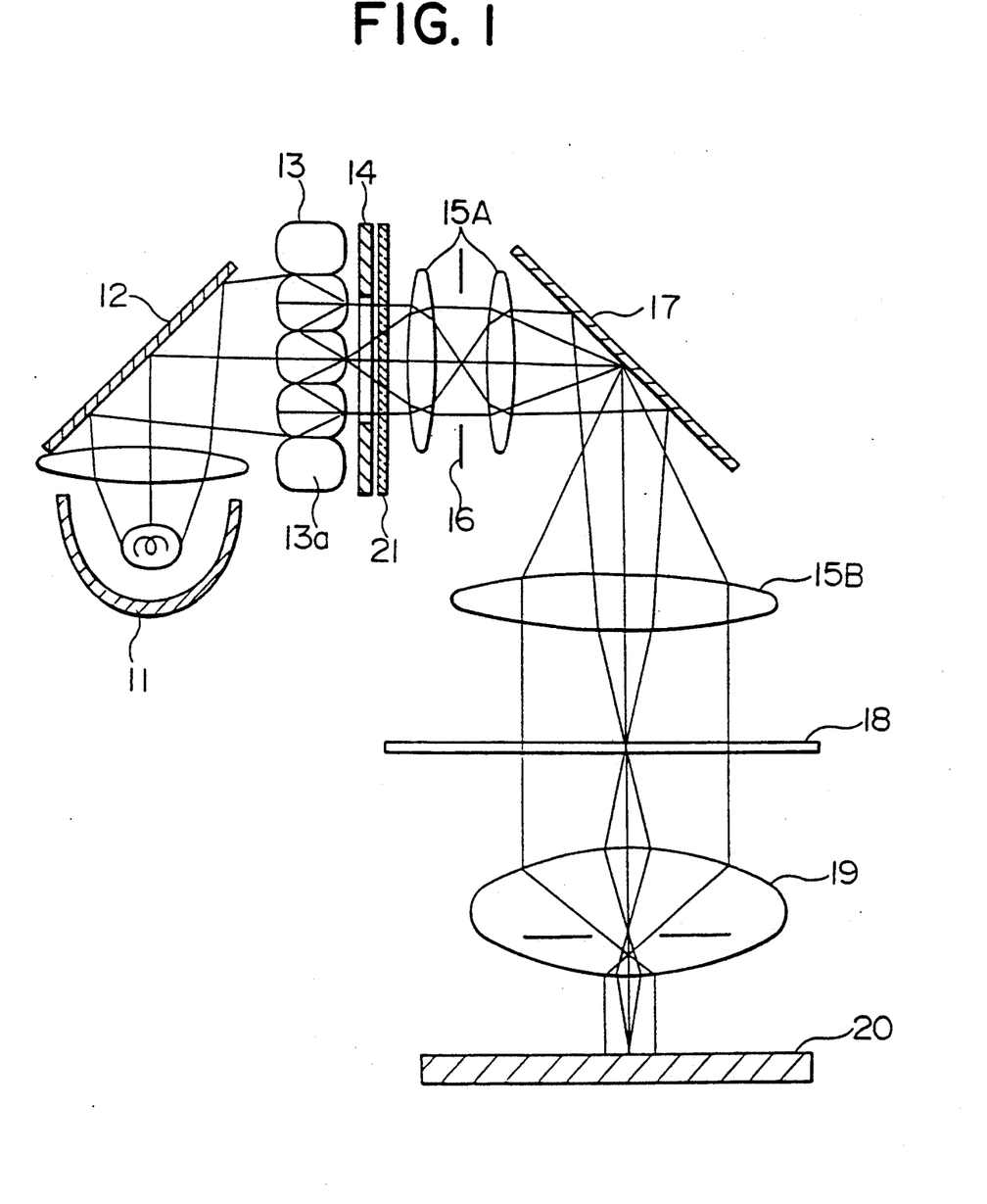
FIG. 1 shows an optical system of a projection exposure apparatus according to a first embodiment of the present invention.

Referring first to FIG. 1, an exposure apparatus includes a lamp house 11 for emanating an illumination light, a mirror 12, a fly's eye lens 13 disposed in front of the lamp house 11 with the mirror 12 between the lamp house 11 and the fly's eye lens 13, an aperture member 14, a polarizer 21 located in front of the fly's eye lens 13 with the aperture member 14 between the fly's eye lens 13 and the polarizer 21, a relay lens 15A, a stop 16, a mirror 17, a condenser lens 15B, a photo mask 18 on which a circuit pattern is formed, a projection lens 19, and a wafer located in front of the mask 18 with the projection lens 19 between the mask 18 and the wafer 20.

The polarizer 21 converts the illumination light which has passed through the aperture portion of the aperture member 14 into linearly polarized light.

The operation of this embodiment will be described below. The illumination light emanating from the lamp house 11 reaches the fly's eye lens 13 through the mirror 12, and is split into regions corresponding to individual lenses 13a of the fly's eye lens 13. The light rays emanating from the individual lenses 13a pass through the aperture portion of the aperture member 21, are converted into polarized light by the polarizer 21, pass through the relay lens 15A, the 16, the mirror 17 and the condenser lens 15A, and illuminate the entire surface of the exposure area of the mask 18. Therefore, on the surface of the mask 18, the light rays from the individual lenses 13a of the fly's eye lens 13 are laid on top of one another, and the mask surface is thus illuminated uniformly. The light which has passed through the mask 18 in the manner described above reaches the wafer 20 through the projection lens 19. A resist film on the surface of the wafer 20 is exposed to the illumination light, whereby transfer of the circuit pattern is achieved.

Figure 2:
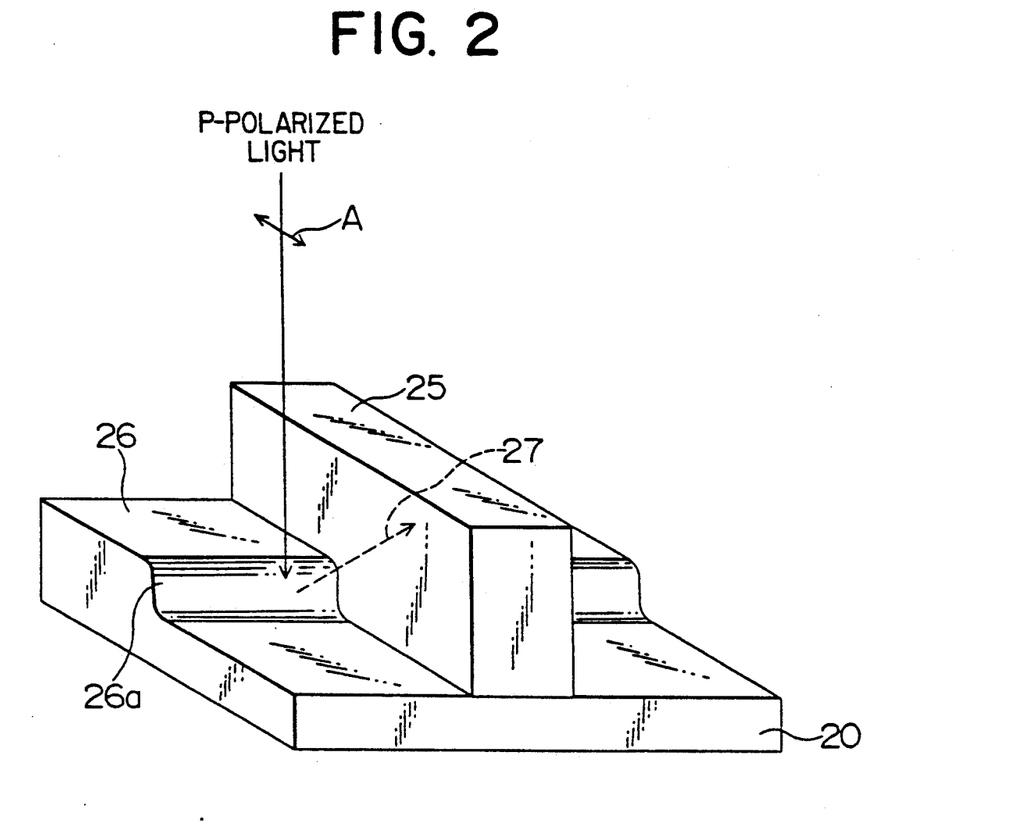
FIG. 2 is a perspective view showing the surface of a wafer exposed, in the first embodiment of the present invention.
Figure 3:
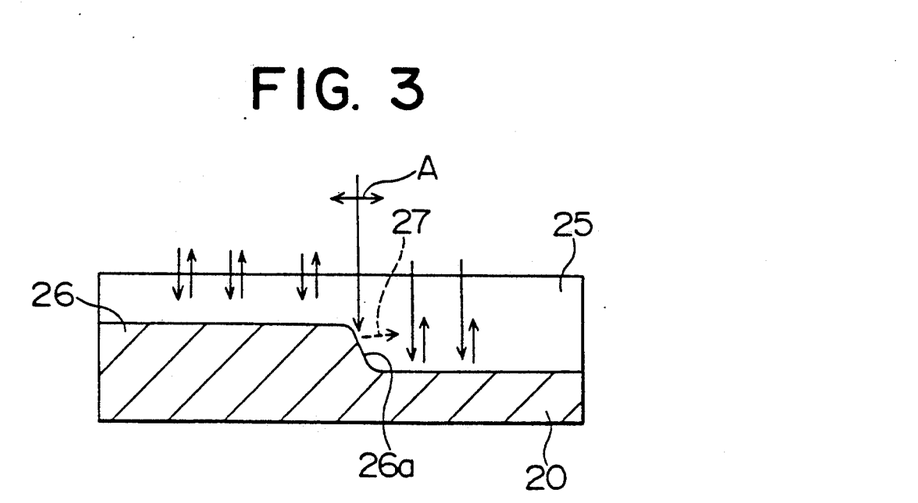
FIG. 3 is a cross-sectional view showing the surface of a wafer exposed in the first embodiment of the present invention.

As a result, a resist pattern 25 such as that shown in FIGS. 2 and 3 is formed on the surface of the wafer 20. Various types of shoulders 26 are present on the surface of the wafer 20 as a consequence of circuit formation. Hence, the direction of the polarizer 21 is adjusted such that an inclined surface 26a at the edge of the shoulder 26 present on the wafer 20 can be illuminated with p-polarized light of the linearly polarized light obtained from the polarizer 21, i.e., such that the plane of polarization is directed in a direction indicated by bidirectional arrows A in FIGS. 2 and 3.

The reflectance Rp of p-polarized light and the reflectance Rs of s-polarized light when the angle of incidence is $\theta i$ and the angle of transmission is $\theta t$ are given by the following equations:

$$Rp = \tan^2(\theta i - \theta t) / \tan^2(\theta i + \theta t)$$

$$Rs = \sin^2(\theta i - \theta t) / \sin^2(\theta i + \theta t)$$

Figure 4:
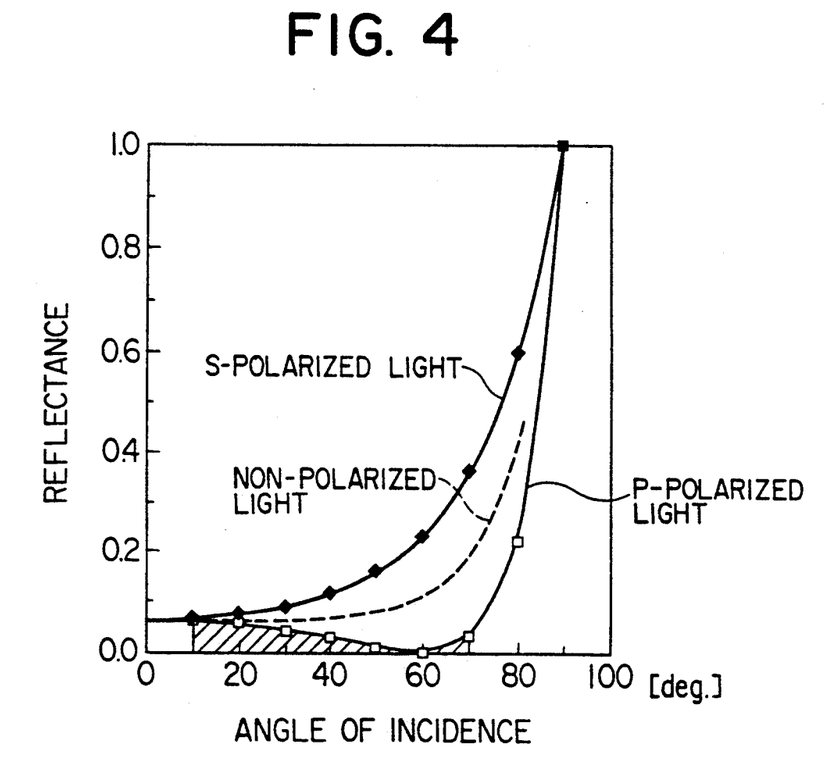
FIG. 4 shows the relation between the angle of incidence and the reflectance of p-polarized light and s-polarized light.

FIG. 4 shows the relation between the reflectances of p-polarized light and s-polarized light and the angle of incidence at which light is incident on an inclined surface made of a resist having an index of refraction n of 1.68. The reflectance of the p-polarized light is smaller than that of the s-polarized light on the whole. Particularly, the reflectance of the p-polarized light is reduced to zero when the angle of incidence is the angle of polarization. In the example shown in FIG. 4, the angle of polarization is near 60 degrees. The broken line in FIG. 4 indicates the reflectance of non-polarized light.

In the projection exposure apparatus shown in FIG. 1, since the illumination light is incident on a single spot on the surface of the wafer 20 at an convergent angle of about 30 degrees, if an inclined surface having an inclination angle of, for example, 40 degrees is present on the surface of the wafer 20, the actual angle of incidence at which the light is incident on the inclined surface ranges between 10 and 70 degrees. Therefore, the area obtained by integrating the curve representing the reflectance in FIG. 4 in the range of angles of incidence from 10 degrees to 70 degrees corresponds to the intensity of light which is reflected by the inclined surface having an inclination angle of 40 degrees. More specifically, when p-polarized light alone is used for exposure, the intensity of the light which is reflected by the inclined surface corresponds to the area indicated by a hatched portion in FIG. 4, and is thus less than half of the intensity of light reflected when non-polarized light is used.

Thus, when the direction of the polarizer 21 is adjusted so that an inclined surface 26a at the edge of the shoulder 26 on the wafer 20 can be illuminated for exposure with p-polarized light alone, as shown in FIGS. 2 and 3, the intensity of light 27 reflected by the inclined surface 26a is greatly reduced. As a result, halation near the inclined surface 26a is restricted, and excess exposure of a resist pattern 25 and hence concavities in adjacent parts of the resist pattern are prevented.

In the above-described embodiment, the polarizer 21 and the aperture member 14 are provided separately. However, the polarizer may be incorporated in the aperture portion of the aperture member 14.

Figure 5:
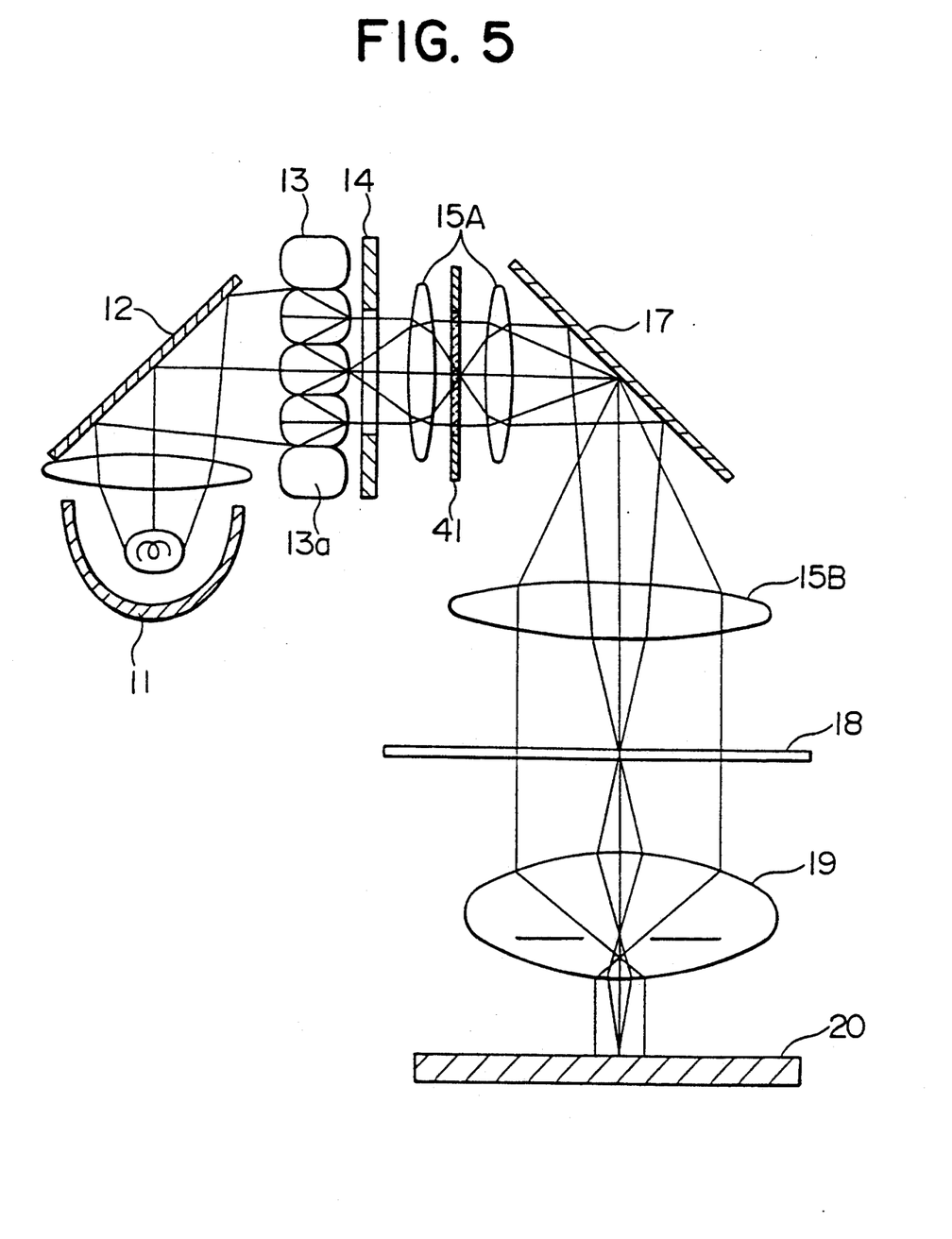
FIG. 5 shows an optical system of a projection exposure apparatus according to a second embodiment of the present invention.

Alternatively, a polarizer 41 may be disposed at the position of the stop, as shown in FIG. 5. Furthermore, since the surface of the stop is optically equivalent to the surface of the mask, when only part of the illumination light is converted into linearly polarized light by using a fine polarizer, it is possible to selectively expose with polarized light only the portion of the circuit pattern on the mask 18 where halation readily occurs.

Figure 6:
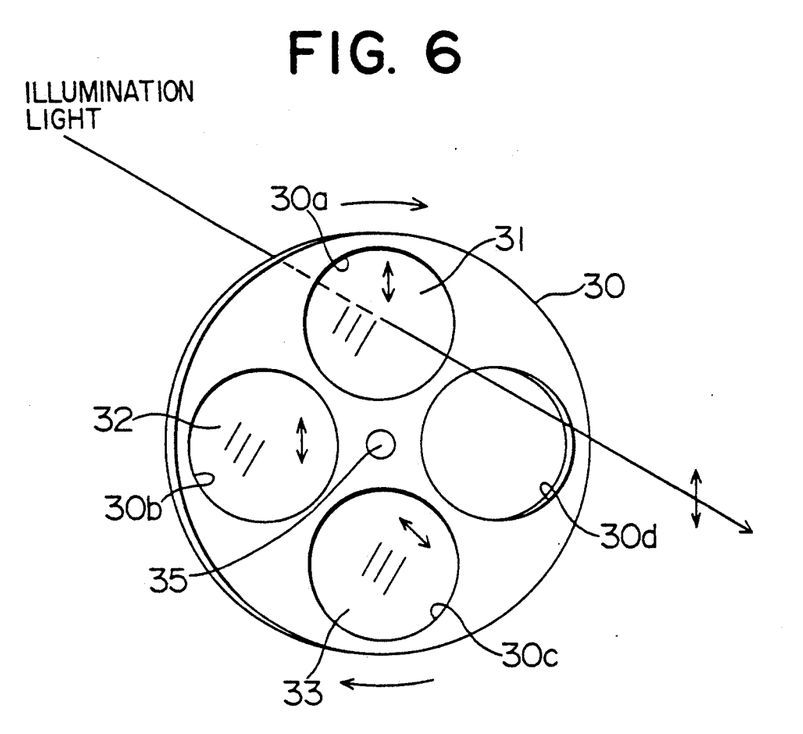
FIG. 6 shows a change-over device employed in a third embodiment of the present invention.

It may also be arranged so that a single polarizer is not fixed in the optical path of the illumination light and a polarizer suited to the exposure process is selected from a plurality of polarizers and used. FIG. 6 shows a device used for such an arrangement. A disk-like substrate 30 has four open portions including first, second, third and fourth open portions 30a through 30d, and polarizers 31 through 33 are respectively provided in the first through third open portions 30a through 30c with different direction planes of polarization. No polarizer is provided in the fourth open portion 30d. The substrate 30 is rotatable about a central portion 35 thereof. It is therefore possible to selectively locate one of the four open portions 30a through 30d in the optical path of the illumination light by rotating the substrate 30. For example, if the open portions 30a through 30c are selected, linearly polarized light polarized in the vertical direction, in the horizontal direction and obliquely are respectively obtained, as indicated by bidirectional arrows in the polarizers 31 through 33. If the open portion 30d is selected, the illumination light passes without being polarized. Accordingly, polarized light in the optimum direction or non-polarized light can be selected for each exposure process.

Figure 7:
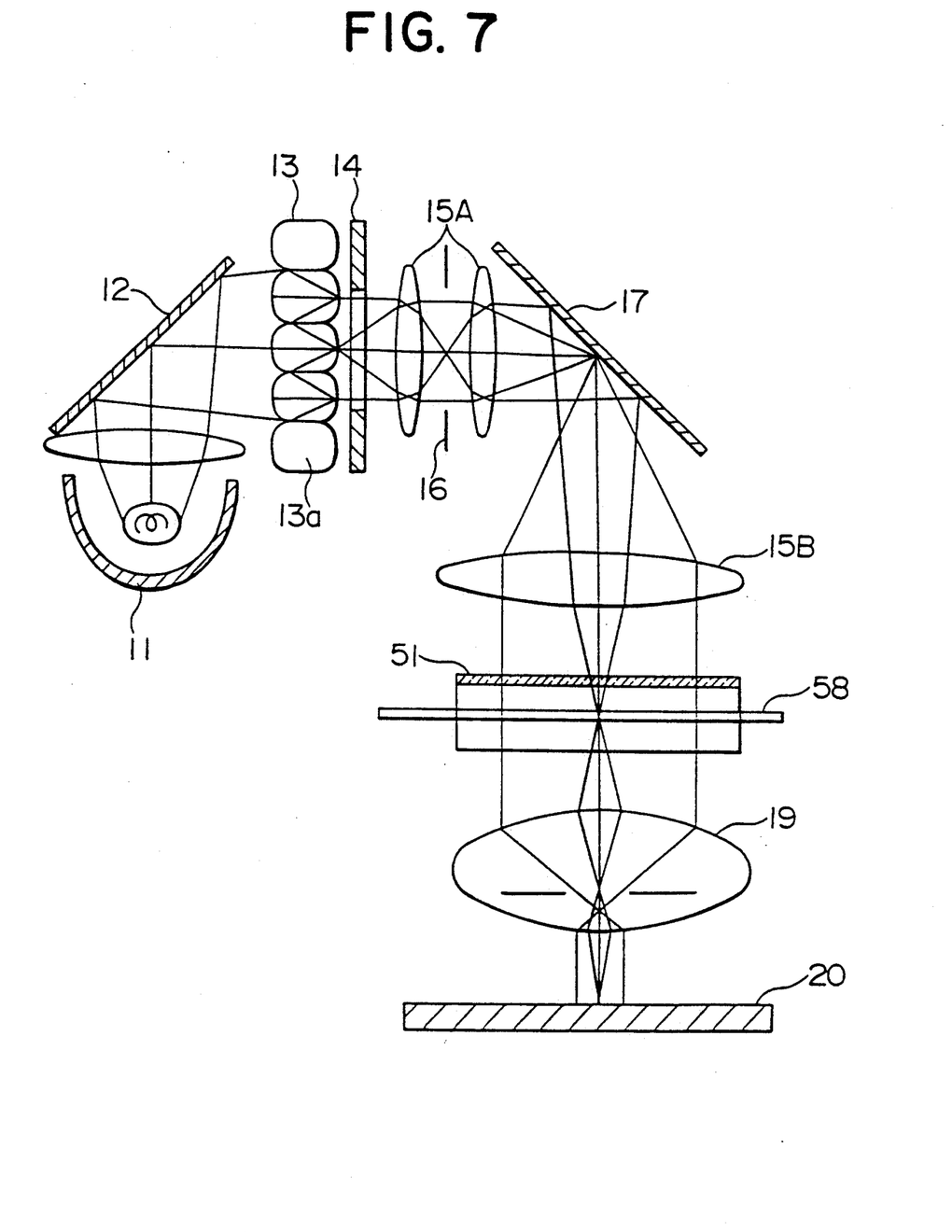
FIG. 7 shows an optical system of a projection exposure apparatus according to a fourth embodiment of the present invention.

A polarizer 51 may be disposed as an upper pellicle film for a photo mask 58, as shown in FIG. 7. The polarizer 51 is mounted in a direction which ensures that it can pass only the polarized light in the optimum direction according to the pattern on the photo mask 58. In that case, since the photo mask 58 and the polarizer 51 are formed as one unit, a polarizer suited to an exposure process can be selected by changing the photo mask. It is therefore not necessary for the polarizers to be changed with the device shown in FIG. 6.

Figure 8:
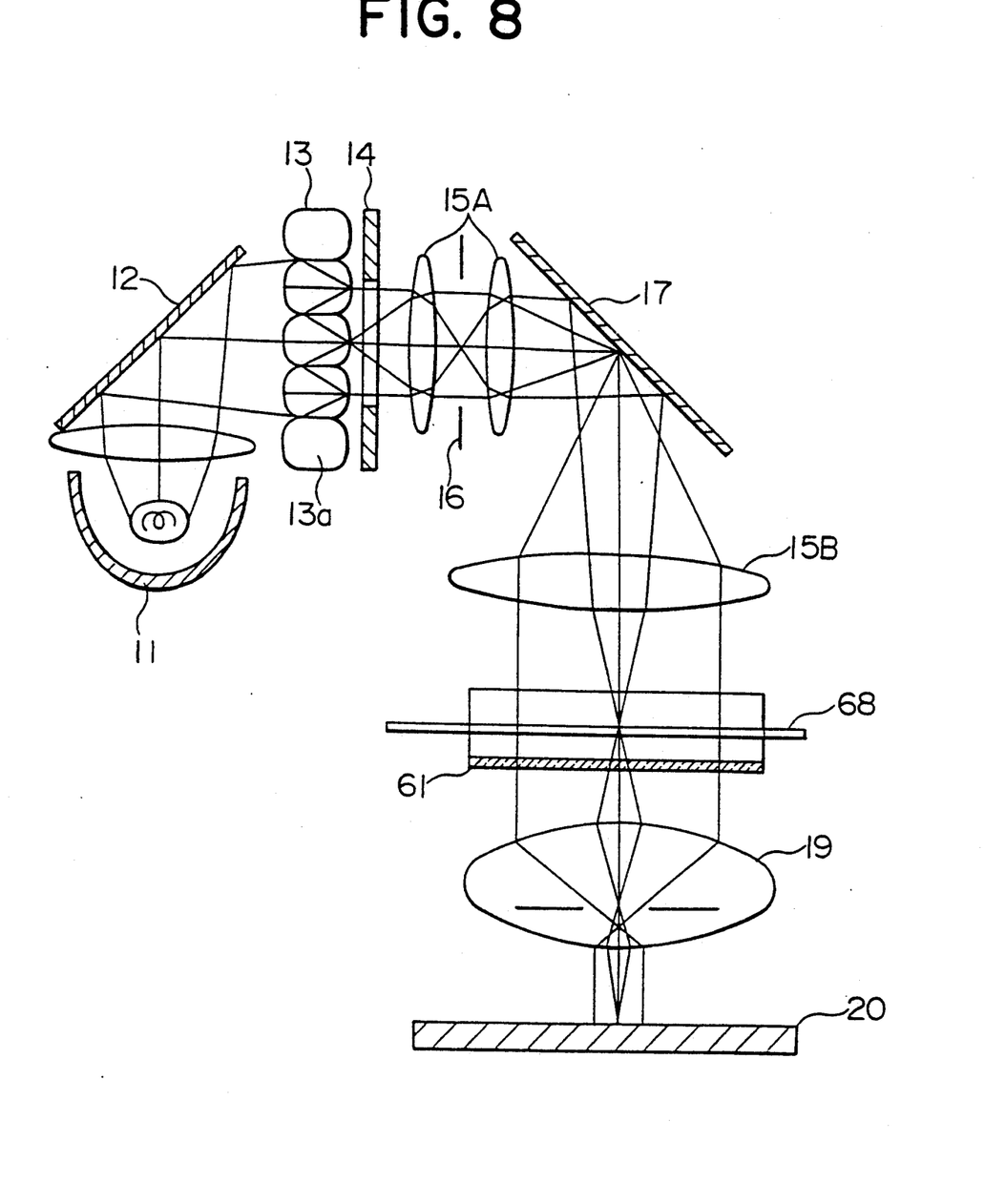
FIG. 8 shows an optical system of a projection exposure apparatus according to a fifth embodiment of the present invention.

Similarly, a polarizer 61 may be disposed as a lower pellicle film for a photo mask 68, as shown in FIG. 8.

The polarizer can be disposed at any position on the optical path of the illumination light. Therefore, the polarizer can be disposed at a site other than those shown in the above-described embodiments.

What is claimed is:

1. A projection exposure apparatus comprising:

a light source for producing illumination light;

a condenser lens for condensing the illumination light emanating from said light source onto a mask including a circuit pattern;

a projection lens for condensing illumination light that has passed through the mask onto a surface of a wafer; and a polarizer for converting the illumination light into linearly polarized light so that an inclined surface on the surface of the wafer is illuminated only with p-polarized light.

2. A projection exposure apparatus according to claim 1 wherein said polarizer is disposed between said light source and said condenser lens.

3. A projection exposure apparatus according to claim 1 including a stop disposed between said light source and said condenser lens wherein said polarizer is disposed at said stop.

4. A projection exposure apparatus according to claim 1 wherein said polarizer is a pellicle film of the mask on a side of the mask toward said condenser lens.

5. A projection exposure apparatus according to claim 1 wherein said polarizer is a pellicle film of the mask on a side of the mask toward said projection lens.

6. A projection exposure apparatus according to claim 1 comprising an aperture member disposed between said light source and said condenser lens.

7. A projection exposure apparatus comprising:

a light source for producing illumination light;

a condenser lens for condensing the illumination light emanating from said light source onto a mask including a circuit pattern;

a projection lens for condensing the illumination light that has passed through the mask onto a surface of a wafer;

a plurality of polarizers for respectively converting the illumination light into linearly polarized light, said polarizers producing correspondingly different directions of plane polarized light; and a device for selectively positioning one of said plurality of polarizers in an optical path of the illumination light so that an inclined surface on the surface of the wafer is illuminated only with p-polarized light.

8. A projection exposure apparatus according to claim 7 wherein said device includes a rotatable disk-like substrate having a plurality of open portions, said polarizers being mounted in respective open portions.

* * * * *